(12) United States Patent
Wu

(10) Patent No.: US 8,813,354 B2
(45) Date of Patent: Aug. 26, 2014

(54) METHOD OF MANUFACTURING AN ELECTROMAGNETIC SHIELDING STRUCTURE

(75) Inventor: Ming-Che Wu, Nantou County (TW)

(73) Assignees: Universal Scientific Industrial (Shanghai) Co., Ltd., Shanghai (CN); Universal Global Scientific Industrial Co., Ltd., Nantou County (TW)

( * ) Notice: Subject to any disclaimer, the term of this patent is extended or adjusted under 35 U.S.C. 154(b) by 389 days.

(21) Appl. No.: 13/195,087

(22) Filed: Aug. 1, 2011

(65) Prior Publication Data

US 2012/0243199 A1 Sep. 27, 2012

(30) Foreign Application Priority Data

Mar. 23, 2011 (TW) .............................. 100109929 A

(51) Int. Cl.
*H05K 3/30* (2006.01)
*H05K 9/00* (2006.01)
*H01L 23/552* (2006.01)
*H01L 25/065* (2006.01)

(52) U.S. Cl.
CPC .............. *H05K 9/003* (2013.01); *H01L 23/552* (2013.01); *H01L 2924/0002* (2013.01); *H01L 25/0655* (2013.01)
USPC .................... 29/832; 29/830; 29/840; 29/846; 438/123

(58) Field of Classification Search
CPC ........... H01L 23/49541; H01L 23/552; H05K 9/0024

USPC ............. 29/830, 832, 840, 846; 438/123, 127
See application file for complete search history.

(56) References Cited

U.S. PATENT DOCUMENTS

| | | | |
|---|---|---|---|
| 7,187,060 B2 * | 3/2007 | Usui .............................. | 257/659 |
| 7,327,015 B2 * | 2/2008 | Yang et al. ..................... | 257/660 |
| 8,053,872 B1 * | 11/2011 | Swan et al. .................... | 257/659 |
| 8,076,757 B2 * | 12/2011 | Pagaila et al. ................. | 257/659 |
| 8,349,659 B1 * | 1/2013 | Swan et al. .................... | 257/659 |
| 8,350,367 B2 * | 1/2013 | Chiu et al. ..................... | 257/659 |
| 8,614,899 B2 * | 12/2013 | Madsen et al. ................ | 361/777 |
| 2012/0273926 A1 * | 11/2012 | Pagaila ......................... | 257/659 |

\* cited by examiner

*Primary Examiner* — Carl Arbes
(74) *Attorney, Agent, or Firm* — Rosenberg, Klein & Lee

(57) ABSTRACT

An electromagnetic interference (EMI) shielding structure, which includes: a substrate, at least one chip unit, a packing layer, and an EMI shielding unit. The chip unit is disposed on the surface of the substrate and electrically coupled thereto. The packing layer is formed on the substrate and covers the chip unit. The EMI shielding unit includes: a first, second, and third shielding layer. The first shielding layer covers the outer surface of the packing layer and the lateral surface of the substrate. The second and third shielding layer respectively covers the outer surface of the first and second shielding layer. Based on the instant disclosure, the EMI shielding unit uses the methods of sputtering and electroless plating, to increase the adhesion strength of the EMI shielding unit and make the thickness of the shielding layer uniform. The instant disclosure raises the EMI shielding efficiency and lowers the manufacturing cost.

2 Claims, 4 Drawing Sheets

US 8,813,354 B2

METHOD OF MANUFACTURING AN ELECTROMAGNETIC SHIELDING STRUCTURE

BACKGROUND OF THE INVENTION

1. Field of the Invention

The present invention relates to an electromagnetic interference (EMI) shielding structure and manufacturing method thereof; in particular, to an EMI structure and manufacturing method thereof that raises the EMI shielding efficiency.

2. Description of Related Art

The electronic circuit components used by today's electronic products all requires electromagnetic interference (EMI) shielding structure. The primary purpose of which is to prevent the effect of electromagnetic interference from occurring between each circuit components. For each type of electronic products, only those with adequate EMI shielding structure can operate in a stable fashion with high reliability, and so as to gain the trust and loyalty of users. Therefore, for electronic fields of computer, mobile phones, transportation devise, navigation systems, household appliances, all require technology related to EMI shielding structure.

Manufacturing technologies related to EMI shielding structures, are somewhat limited due to effects of uneven thickness caused by sputtering manufacturing method, so that the overall physical structure is large, or the manufacturing time is prolonged, so that EMI shielding efficiency is non-ideal and the manufacturing cost is increased. Therefore, research on uniform thickness of the EMI shielding structure is the foremost goal for the present improvement of EMI shielding structure.

SUMMARY OF THE INVENTION

The object of the present invention is to provide an electromagnetic interference (EMI) shielding structure and manufacturing method thereof that can increase electromagnetic interference shielding efficiency.

In order to achieve the aforementioned objects, according to an embodiment of the present invention, an EMI shielding structure is provided, which includes: a substrate, at least one chip unit, a packing layer, and an EMI shielding unit. The chip unit is disposed on the surface of the substrate and electrically coupled thereto; the packing layer is formed on the substrate and covers the chip unit. The EMI shielding unit includes a first shielding layer, a second shielding layer, and a third shielding layer. The first shielding layer covers the outer surface of the packing layer and the lateral surface of the substrate, the second shielding layer covers the outer surface of the first shielding layer, and the third shielding layer covers the outer surface of the second shielding layer.

Additionally, according to an embodiment of the present invention an EMI shielding structure manufacturing method is provided, the steps include: dispose at least one chip unit on the surface of the substrate. Form a packing layer on the substrate and covers the chip unit. Simultaneously disposing a first shielding layer over the outer surface of the packing layer and the lateral surface of the substrate. Disposing a second shielding layer over the outer surface of the first shielding layer. Disposing a third shielding layer over the outer surface of the second shielding layer. Thereby the EMI shielding structure of the present invention is formed.

Per aforementioned, the EMI shielding structure provided by an embodiment of the present invention utilizes alternating sputtering manufacturing process and chemical electroless plating manufacturing process, so as to make the thicknesses on the top surface and lateral surface of the EMI shielding structure more uniform. Thereby raises the EMI shielding efficiency and lowers the manufacturing cost.

In order to further the understanding regarding the present invention, the following embodiments are provided along with illustrations to facilitate the disclosure of the present invention.

DETAILED DESCRIPTION OF THE PREFERRED EMBODIMENTS

The aforementioned illustrations and following detailed descriptions are exemplary for the purpose of further explaining the scope of the present invention. Other objectives and advantages related to the present invention will be illustrated in the subsequent descriptions and appended drawings.

Figure 1:
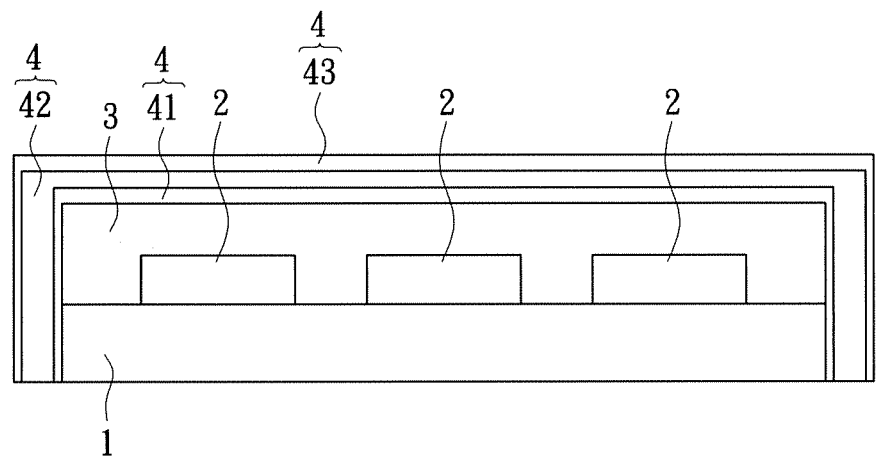
FIG. 1 shows a cross-sectional view of an electromagnetic interference (EMI) shielding structure according to an embodiment of the present invention.

Reference FIG. 1, which shows a cross-sectional view of an electromagnetic interference (EMI) shielding structure according to an embodiment of the present invention. According to an embodiment of the present invention, the EMI shielding structure includes: a substrate 1, at least one chip unit 2, a packing layer 3, and an EMI shielding unit 4.

The substrate 1 can be a circuit board, such as a flexible printed circuit board (FPCB) or a non-flexible printed circuit board. The chip unit 2 is disposed on the surface of the substrate 1, and the chip unit 2 is electrically coupled to the substrate 1. Therein, the number of the chip unit 2 is not limited, and may depend on the product requirement to be disposed upon the surface of the substrate 1. The packing layer 3 is formed on the substrate 1 and covers the chip unit 2. The packing layer 3 can be different types of packing material, such as: thermoset plastic, epoxy resin, etc.

Figure 1A:
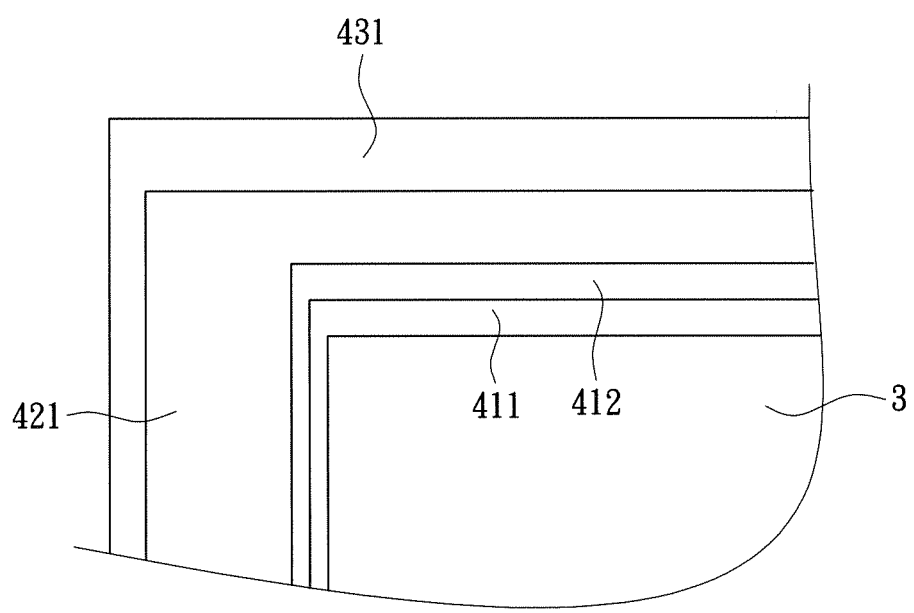
FIG. 1A shows a locally enlarged view of an EMI shielding unit of the EMI shielding structure according to FIG. 1.

The EMI shielding unit 4 is formed from 3 EMI shielding layers, respectively being a first shielding layer 41, a second shielding layer 42, and a third shielding layer 43. The first shielding layer 41 covers the outer surface of the packing layer 3 and the lateral surface of the substrate 1, wherein the first shielding layer 41 further includes a first stainless steel sputtering layer 411 and a copper sputtering layer 412 (see FIG. 1A, which shows a locally enlarged view of the EMI shielding unit 4). In other words, the first stainless steel sputtering layer 411 covers the surface of the packing layer 3 and the lateral surface of the substrate 1, the copper sputtering layer 412 covers the surface of the first stainless steel sputtering layer 411.

Furthermore, the second shielding layer 42 covers the outer surface of the first shielding layer 41. In other words, all the surface of the first shielding layer 41 is covered by the second shielding layer 42. Therein, the second shielding layer 42 is a chemical copper plating layer 421.

Additionally, the third shielding layer 43 covers the outer surface of the second shielding layer 42. Therein, the third shielding layer 43 is a second stainless steel sputtering layer 431.

The aforementioned first stainless steel sputtering layer 411, the second stainless steel sputtering layer 431, and the copper sputtering layer 412 can be a metal plating layer between the thickness of 0.05 um and 0.15 um, the chemical copper plating layer can be a metal plating layer between the thicknesses of 1 um and 3 um.

If good EMI shielding effect is to be formed, then the overall structure needs to have grounding characteristics. Therefore, the EMI shielding unit 4 and the substrate 1 needs to be in contact relation, so as to form electrically coupled connection. Due to the first shielding layer 41 covering the lateral surface of the substrate 1, the EMI shielding unit 4 and the substrate 1 are electrically coupled.

Reference FIG. 2A to 2E, which are respectively shows a cross-sectional view of an EMI shielding structure according to the first to fifth step of an embodiment of the present invention. According to the EMI shielding structure manufacturing method of the present invention, the steps include:

Step 1 (see FIG. 2A), first dispose at least one chip unit 2 on the surface of the substrate 1, and the chip unit 2 is electrically coupled to the substrate 1.

Step 2 (see FIG. 2B), form a packing layer 3 on the substrate 1 and covers the chip unit 2. That is, every chip unit 2 on the substrate 1 is covered by the packing layer 3.

Step 3 (see FIG. 2C), simultaneously disposing a first shielding layer 41 over the outer surface of the packing layer 3 and the lateral surface of the substrate 1. Therein, the first shielding layer 41 cover the outer surface of the packing layer 3 and the lateral surface of the substrate 1 via sputtering manufacturing process. Furthermore, the first shielding layer 41 includes the first stainless steel sputtering layer 411 and the copper sputtering layer 412. Therefore, the first stainless steel sputtering layer 411 simultaneously covers the outer surface of the packing layer 3 and the lateral surface of the substrate 1, and the copper sputtering layer 412 covers the outer surface of the first stainless steel sputtering layer 411. However, the sputtering manufacturing process makes the thickness ratio between the sputtered top surface and the lateral surface to be about 3:1, so that the sputtered top surface and the lateral surface become uneven in thickness. In order to satisfy the minimum thickness requirement, the next step would further increase the sputtering lateral surface thickness, so that the top and lateral surface thickness becomes more equivalent.

Step 4 (see FIG. 2D), disposing a second shielding layer 42 over the outer surface of the first shielding layer 41. Therein the second shielding layer 42 is formed via chemical electroless plating process, so as to cover the outer surface of the first shielding layer 41. In other words, the second shielding layer 42 is the chemical copper plating layer 421, which differs from the sputtering manufacturing process utilized by the first shielding layer 41. Using the chemical electroless plating process, can target the lateral surface of the object being plated for increasing thickness, thereby compensate for the uneven thickness issue resulted from the preceding step.

Figure 2A:
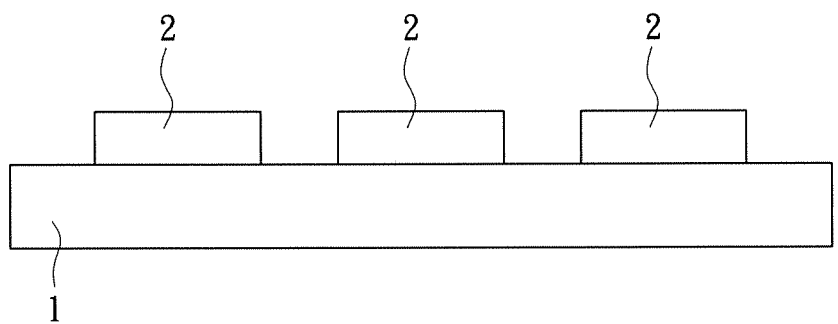
FIG. 2A shows a cross-sectional view of an EMI shielding structure according to the first step of an embodiment of the present invention.
Figure 2B:
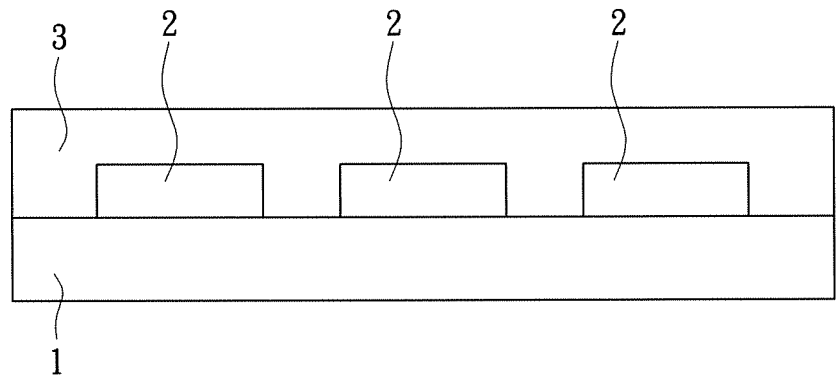
FIG. 2B shows a cross-sectional view of an EMI shielding structure according to the second step of an embodiment of the present invention.
Figure 2C:
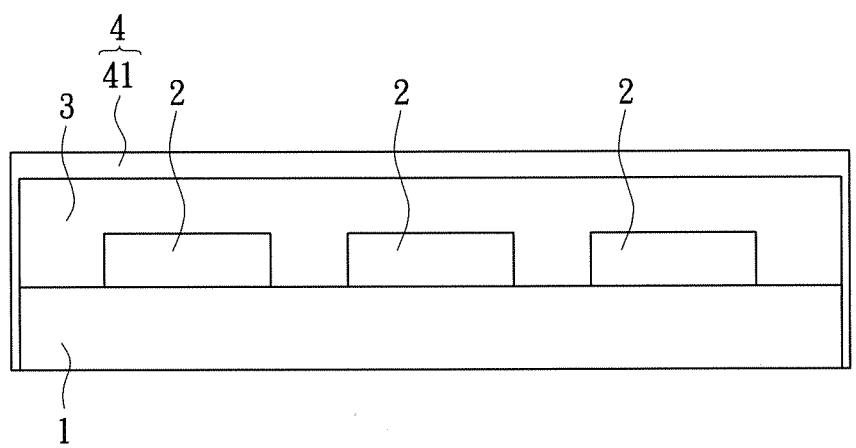
FIG. 2C shows a cross-sectional view of an EMI shielding structure according to the third step of an embodiment of the present invention.
Figure 2D:
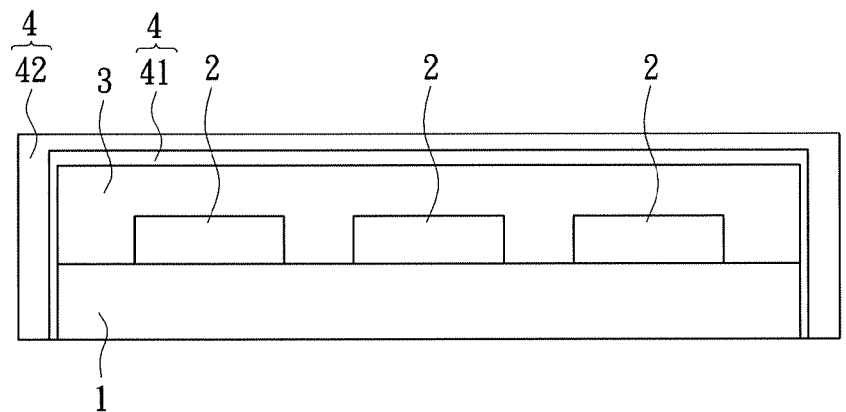
FIG. 2D shows a cross-sectional view of an EMI shielding structure according to the fourth step of an embodiment of the present invention.
Figure 2E:
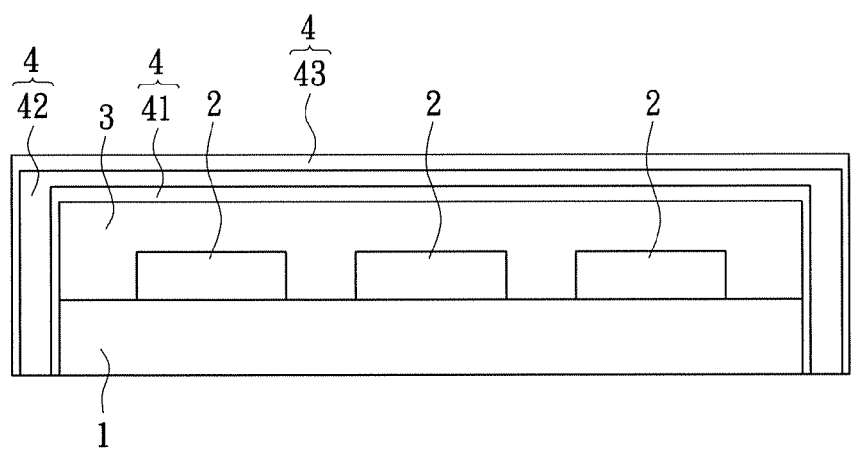
FIG. 2E shows a cross-sectional view of an EMI shielding structure according to the fifth step of an embodiment of the present invention.

Therefore, as can be seen from FIG. 2D, the lateral thickness of the second shielding layer 42 is thicker than the upper surface thickness.

Step 5 (see FIG. 2E), dispose a third shielding layer 43 over the outer surface of the second shielding layer 42. Therein, the third shielding layer 43 covers the outer surface of the second shielding layer 42 through sputtering manufacturing process. In other words, the third shielding layer 43 is the second stainless steel sputtering layer 431, using the same sputtering manufacturing process as the first shielding layer 41. At this step, the EMI shielding structure of the present invention is complete.

Through the EMI shielding structure formed via the aforementioned steps, and through the alternating sputtering manufacturing process and chemical electroless plating manufacturing process, the ratio of top and lateral thickness of the EMI shielding unit 4 is roughly 1:1, so that not only does the EMI shielding effect increases, but the manufacturing cost is also reduced. This is because prior manufacturing method are uneven in thickness on the top and lateral surface, so that when the lateral thickness achieved the minimum EMI shielding thickness requirement, the top thickness would exceed the minimum EMI shielding thickness requirement, and thereby result in excess layer thickness.

Figure 3:
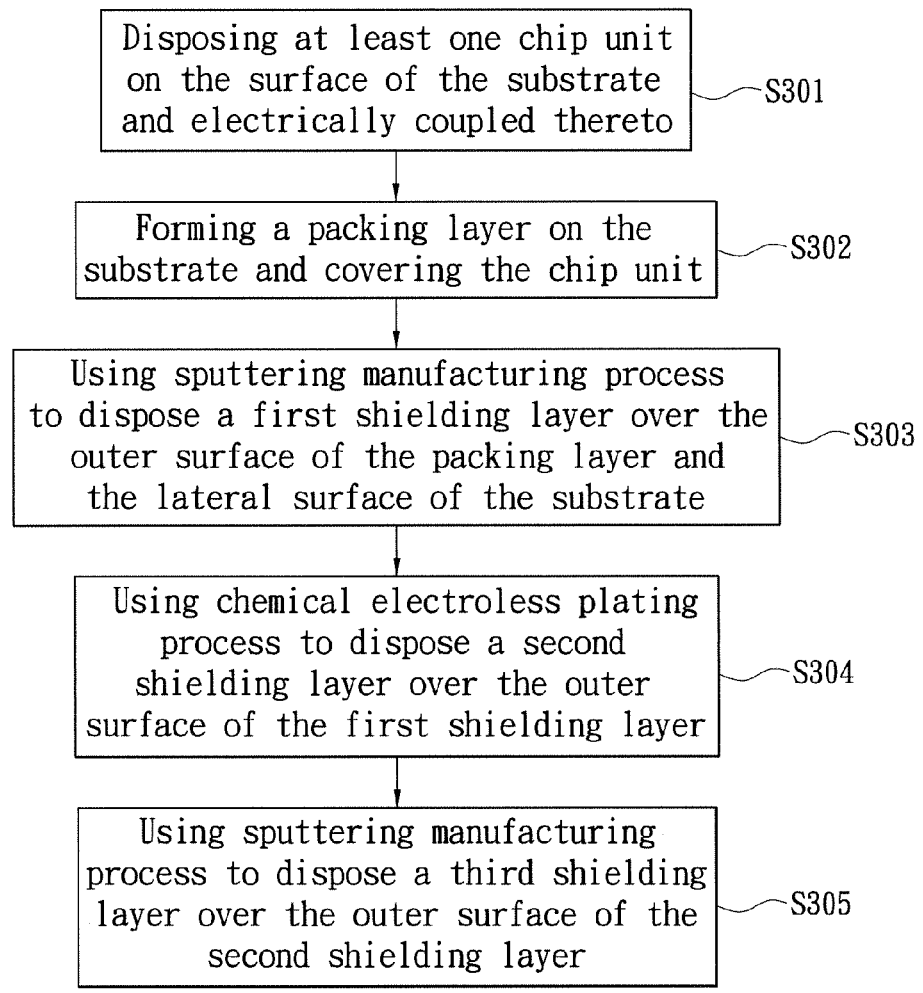
FIG. 3 shows a flow chart diagram of an EMI shielding structure manufacturing method according to the present invention.

Reference FIG. 3, which shows a flow chart diagram of an EMI shielding structure manufacturing method according to the present invention. Steps S301 to S305 respectively represents the first step to fifth step from an embodiment of the present invention. One can better understand the overall manufacturing method of the present invention via FIG. 3.

Possible Effects of the Embodiment

According to the embodiment of the present invention, the aforementioned EMI shielding structure utilizes alternating sputtering manufacturing process and chemical electroless plating manufacturing process, so as to make the thicknesses on the top surface and lateral surface of the EMI shielding structure more uniform. Thereby raises the EMI shielding efficiency and lowers the manufacturing cost.

The descriptions illustrated supra set forth simply the preferred embodiments of the present invention; however, the characteristics of the present invention are by no means restricted thereto. All changes, alternations, or modifications conveniently considered by those skilled in the art are deemed to be encompassed within the scope of the present invention delineated by the following claims.

What is claimed is:

1. An electromagnetic interference shielding structure manufacturing method, the steps comprising:
    disposing at least one chip unit on the surface of a substrate;
    forming a packing layer on the substrate and covering the chip unit;
    performing a sputtering manufacturing process to form a first shielding layer over the outer surface of the packing layer and the lateral surface of the substrate, wherein the first shielding layer comprises a first stainless steel sputtering layer and a copper sputtering layer;
    performing a chemical electroless plating process to form a second shielding layer over the outer surface of the first shielding layer after the first shielding layer is formed, wherein the second shielding layer is a chemical copper plating layer; and
    performing a sputtering manufacturing process to form a third shielding layer over the outer surface of the second shielding layer after the second shielding layer is formed, wherein the third shielding layer is a second stainless steel sputtering layer.

2. The electromagnetic interference shielding structure manufacturing method according to claim 1, wherein the first stainless steel sputtering layer covers the outer surface of the packing layer and the lateral surface of the substrate, and wherein the copper sputtering layer covers the surface of the first stainless steel sputtering layer.

\* \* \* \* \*